(12) United States Patent
Lee

(10) Patent No.: US 9,257,898 B1
(45) Date of Patent: Feb. 9, 2016

(54) POWER SUPPLYING CIRCUIT AND SOFT-START CIRCUIT OF THE SAME

(71) Applicant: Himax Analogic, Inc., Tainan (TW)

(72) Inventor: Chow-Peng Lee, Tainan (TW)

(73) Assignee: HIMAX ANALOGIC, INC., Tainan (TW)

( * ) Notice: Subject to any disclaimer, the term of this patent is extended or adjusted under 35 U.S.C. 154(b) by 0 days.

(21) Appl. No.: 14/461,135

(22) Filed: Aug. 15, 2014

(51) Int. Cl.
- H02M 1/32 (2007.01)
- H03K 17/16 (2006.01)

(52) U.S. Cl.
CPC .............. *H02M 1/32* (2013.01); *H03K 17/164* (2013.01)

(58) Field of Classification Search
CPC ... H03K 17/164; H03K 17/127; H03K 3/033; H03K 4/502; H03K 7/08; G11C 29/02; G11C 29/026; G11C 7/06; G11C 7/14; G11C 15/403; G11C 15/046; G11C 16/10; G11C 16/28
USPC .................. 327/142, 143, 198, 333, 536, 537
See application file for complete search history.

(56) References Cited

U.S. PATENT DOCUMENTS

| | | | | |
|---|---|---|---|---|
| 6,249,154 B1* | 6/2001 | Jouffre | ................. | H03K 17/063 327/337 |
| 2007/0013356 A1* | 1/2007 | Qiu | ..................... | H02M 3/1584 323/288 |
| 2007/0058398 A1* | 3/2007 | Yang | ....................... | H02M 1/36 363/16 |

* cited by examiner

*Primary Examiner* — John Poos
(74) *Attorney, Agent, or Firm* — Locke Lord LLP; Tim Tingkang Xia, Esq.

(57) ABSTRACT

The soft-start circuit includes a first charging transistor, a first capacitor, a second charging transistor, a second capacitor and a clamping p-type transistor. The first charging transistor is conducted in response to activating pulses to charge the first capacitor through a first output node such that a first output voltage at the first output node gradually increases. The second charging transistor is conducted in response to the first output voltage to charge the second capacitor through a second output node such that a second output voltage at the second output node gradually increases. The clamping p-type transistor includes a source terminal electrically connected to a clamping node, a drain terminal connected to a ground terminal and a gate electrically connected to the second output node, and is conducted when a voltage at the clamping node exceeds a clamping threshold value to pull low the voltage at the clamping node.

18 Claims, 3 Drawing Sheets

US 9,257,898 B1

POWER SUPPLYING CIRCUIT AND SOFT-START CIRCUIT OF THE SAME

BACKGROUND

1. Field of Invention

The present invention relates to an electronic circuit. More particularly, the present invention relates to a power supplying circuit and a soft-start circuit of the same.

2. Description of Related Art

Power supply devices play an essential role in modern information technology. Among all the power supply devices, DC-DC switching regulators are very popular and are widely used for providing regulated DC power sources to electronic components.

However, during an activation period, a large inrush current may occur to increase the voltage at some nodes in the DC-DC switching regulators and thus damage devices.

Accordingly, what is needed is a power supplying circuit and a soft-start circuit of the same to address the issues mentioned above.

SUMMARY

An aspect of the present invention is to provide a soft-start circuit. The soft-start circuit includes a first charging transistor, a first capacitor, a second charging transistor, a second capacitor and a clamping p-type transistor. The first charging transistor is conducted in response to a plurality of activating pulses to provide a first charging current to a first output node every predetermined time interval. The first capacitor is electrically connected to the first output node to receive the first charging current such that a first output voltage at the first output node gradually increases. The second charging transistor is conducted in response to the first output voltage to provide a second charging current to a second output node. The second capacitor is electrically connected to the second output node to receive the second charging current such that a second output voltage at the second output node gradually increases. The clamping p-type transistor includes a source terminal electrically connected to a clamping node, a drain terminal connected to a ground terminal and a gate electrically connected to the second output node, wherein the clamping p-type transistor is conducted when a voltage at the clamping node exceeds a clamping threshold value to pull low the voltage at the clamping node.

Another aspect of the present invention is to provide a power supplying circuit. The power supplying circuit includes a voltage converting circuit and a soft-start circuit. The voltage converting circuit has an operational amplifier configured in a feedback configuration that includes an amplifier output node. The soft-start circuit includes a first charging transistor, a first capacitor, a second charging transistor, a second capacitor and a clamping p-type transistor. The first charging transistor is conducted in response to a plurality of activating pulses to provide a first charging current to a first output node every predetermined time interval. The first capacitor is electrically connected to the first output node to receive the first charging current such that a first output voltage at the first output node gradually increases. The second charging transistor is conducted in response to the first output voltage to provide a second charging current to a second output node. The second capacitor is electrically connected to the second output node to receive the second charging current such that a second output voltage at the second output node gradually increases. The clamping p-type transistor includes a source terminal electrically connected to a amplifier output node, a drain terminal connected to a ground terminal and a gate electrically connected to the second output node, wherein the clamping p-type transistor is conducted when a voltage at the amplifier output node exceeds a clamping threshold value to pull low the voltage at the amplifier output node.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
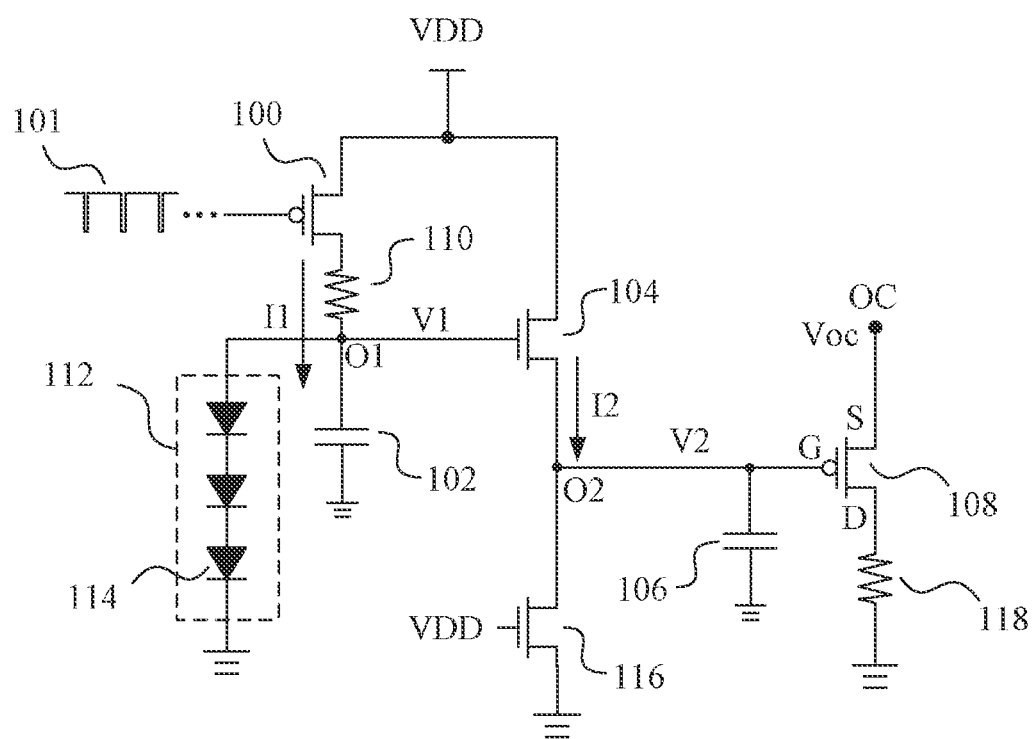
FIG. 1 is a circuit diagram of a soft-start circuit in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a circuit diagram of a soft-start circuit 1 in an embodiment of the present invention. The soft-start circuit 1 includes a first charging transistor 100, a first capacitor 102, a second charging transistor 104, a second capacitor 106 and a clamping p-type transistor 108.

In the present embodiment, the first charging transistor 100 is a p-type transistor, as illustrated in FIG. 1. The gate of the first charging transistor 100 receives a plurality of activating pulses 101 such that the first charging transistor 100 is conducted in response to the activating pulses 101 to provide a first charging current I1 to a first output node O1 every predetermined time interval. In an embodiment, the first charging current I1 is provided to the first output node O1 through a resistor 110 electrically connected to the first charging transistor 100.

In an embodiment, the activating pulses 101 are generated by a one-shot circuit (not shown) every predetermined time interval, in which the activating pulses 101 are low-state pulses to activate the p-type first charging transistor 100.

The first capacitor 102 is electrically connected to the first output node O1 to receive the first charging current I1. As a result, a first output voltage V1 of the first output node O1 gradually increases in a stepwise manner due to the charging activity of the first charging current I1 every predetermined time interval.

In an embodiment, the soft-start circuit 1 selectively includes a voltage-fixing load 112 electrically connected to the first output node O1 to prevent the first output voltage V1 from exceeding a maximum voltage level. In other words, the first output voltage V1 gradually increases due to the first charging current I1 until the maximum voltage level is reached. In an embodiment, the voltage-fixing load 112 includes a plurality of diodes 114 connected in series. Therefore, the maximum voltage level equals to the total cross voltage of the diodes 114 when these diodes 114 are conducted.

For a numerical example, if the cross voltage of a single conducted diode 114 is 0.7 volts, and there are five diodes 114 in the voltage-fixing load 112, the maximum voltage level equals to 0.7×5=3.5 volts.

In the present embodiment, the second charging transistor 104 is an n-type transistor, as illustrated in FIG. 1. The gate of the second charging transistor 104 is connected to the first output node O1. When the first output voltage V1 of the first output node O1 gradually increases, the second charging transistor 104 gradually turns on to be conducted to provide a second charging current I2 to a second output node O2.

The second capacitor 106 is electrically connected to the second output node O2 to receive the second charging current I2. As a result, a second output voltage V2 of the second output node O2 gradually increases due to the charging activity of the second charging current I2.

In an embodiment, the soft-start circuit 1 further includes a discharging transistor 116 electrically connected to the second output node O2 to keep discharging the second output node O2. In an embodiment, a charging ability of the second charging transistor 104 is greater than a discharging ability of the discharging transistor 116. Therefore, the second output node O2 is kept at a low level by the discharging transistor 116 during an initial state. When the second charging transistor 104 gradually turns on due to the first output voltage V1, the second charging transistor 104 is able to provide the second charging current I2 to charge the second capacitor 106 to increase the second output voltage V2 of the second output node O2.

The clamping p-type transistor 108 includes a source terminal S electrically connected to a clamping node OC, a drain terminal D connected to a ground terminal GND and a gate G electrically connected to the second output node O2. In an embodiment, the drain terminal D is connected to a ground terminal GND selectively through a resistor 118. The clamping node OC is electrically connected to an external circuit (not shown).

The clamping p-type transistor 108 is conducted when a voltage Voc at the clamping node OC exceeds a clamping threshold value to pull low the voltage Voc at the clamping node OC. In an embodiment, the clamping threshold value is the sum of the second output voltage V2 and a threshold voltage Vth of the clamping p-type transistor 108. More specifically, the relation between the voltage Voc at the clamping node OC, the second output voltage V2 and the threshold voltage Vth of the clamping p-type transistor 108 is represented by:

$$Voc \leq V2 + Vth$$

As a result, the voltage Voc at the clamping node OC is clamped at a level that equals to V2+Vth.

In summary, when the soft-start circuit 1 is activated, the first output voltage V1 increases in a stepwise manner due to the first charging current I1 provided by the first charging transistor 100. Further, the second output voltage V2 gradually increases due to the second charging current I2 provided by the second charging transistor 104 that is activated by the first output voltage V1. Therefore, the highest value that the voltage Voc can reach is able to increase since the second output voltage V2 gradually increases. A soft-start mechanism of the voltage Voc at the clamping node OC is accomplished.

It is noted that the first charging transistor 100 can be implemented by an n-type transistor, in which the activating pulses 101 are high-state pulses to activate the n-type transistor. Moreover, the second charging transistor 104 can be implemented by a p-type transistor when an appropriate adjustment is made to the soft-start circuit 1.

Figure 2:
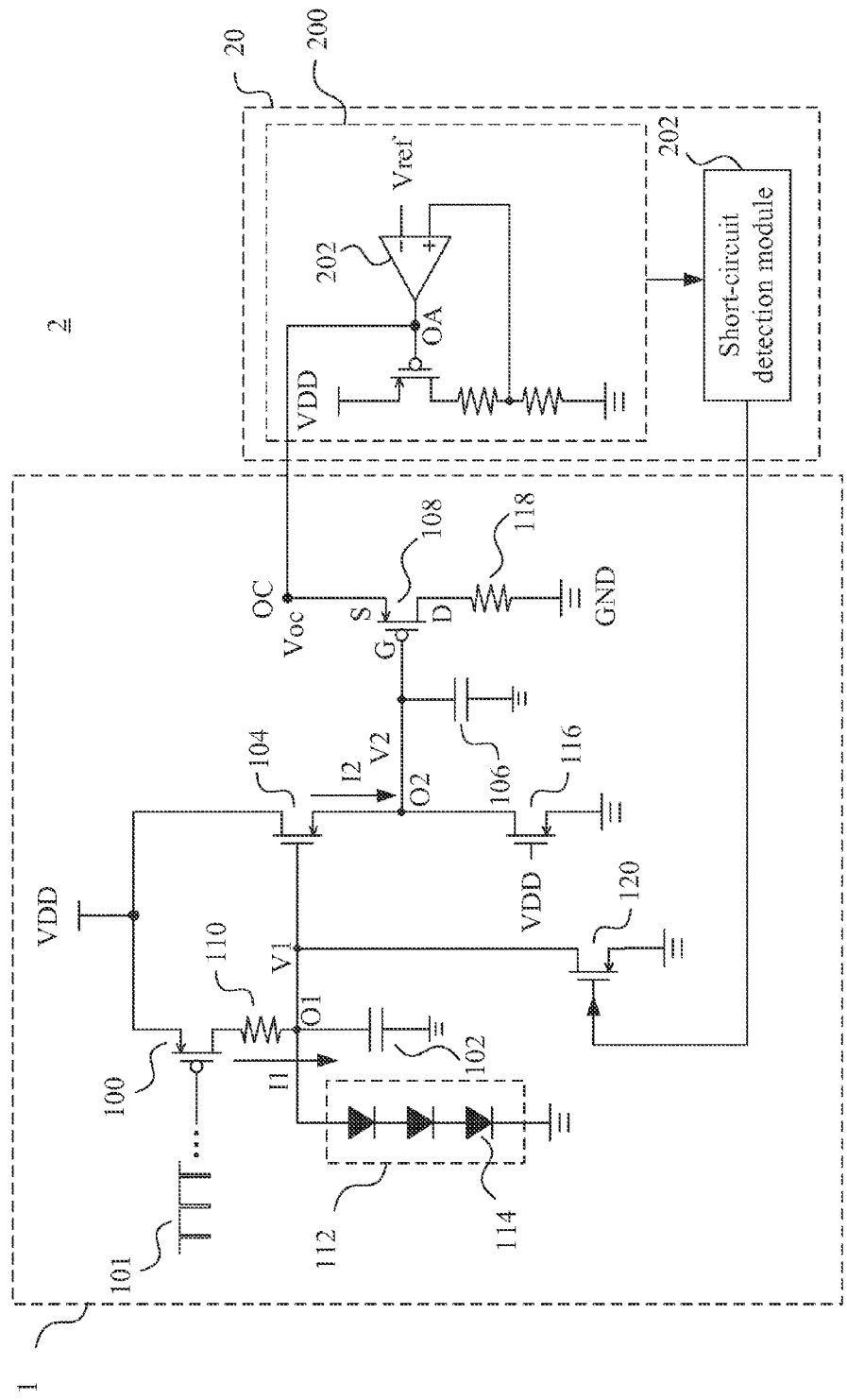
FIG. 2 is a circuit diagram of the power supplying circuit in an embodiment of the present invention.

FIG. 2 is a circuit diagram of the power supplying circuit 2 in an embodiment of the present invention. The power supplying circuit 2 includes the soft-start circuit 1 illustrated in FIG. 1 and a voltage converting circuit 20.

The soft-start circuit 1 substantially includes the same components illustrated in FIG. 1. Therefore, the detail of the similar components of the circuits is not further discussed herein. In the present embodiment, the soft-start circuit 1 further includes a discharging transistor 120 electrically connected to the first output node O1, wherein the discharging transistor 120 can discharge the first output node O1 when it is activated.

In the present embodiment, the voltage converting circuit 20 includes a low-dropout (LDO) regulator 200 that includes an operational amplifier 202. The operational amplifier 202 is configured in a feedback configuration and includes an amplifier output node OA electrically connected to the clamping node OC.

The low-dropout (LDO) regulator 200 can be implemented in various circuit topologies known by those skilled in the art and is not limited by the configuration illustrated in FIG. 2. Moreover, in other embodiments, the voltage converting circuit 122 can either include a boost circuit, a buck circuit or a charge pump circuit.

As a result, the soft-start circuit 1 provides the soft-start mechanism to the voltage converting circuit 20, especially the amplifier output node OA of the operational amplifier 202 in the low-dropout regulator 200 of the voltage converting circuit 20.

Moreover, the voltage converting circuit 20 includes a short-circuit detection module 204 to detect whether there is a short-circuit condition in the voltage converting circuit 20. Once the short-circuit condition is detected, the short-circuit detection module 204 activates the first discharging transistor 120 to discharge the first output node O1.

As a result, the first output voltage V1 at the first output node O1 decreases due to the discharging activity of the discharging transistor 120. The second charging transistor 104 turns off subsequently such that the second output voltage V2 at the second output node O2 decreases due to the presence of the discharging transistor 116. The voltage Voc at the clamping node OC is further pulled low since the voltage Voc is not able to exceed the clamping threshold value related to the second output voltage V2, as described above.

Therefore, a short-circuit protection mechanism is implemented in the power supplying circuit 2 to prevent the voltage converting circuit 20 from burn out.

Figure 3A:
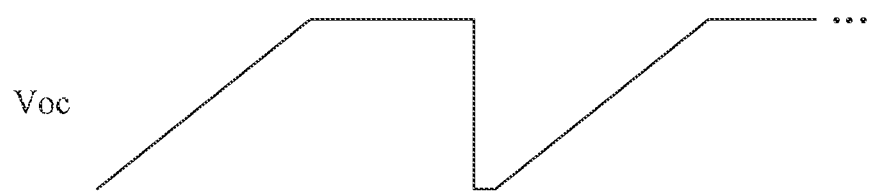
FIG. 3A and FIG. 3B are diagrams of the waveforms of the voltage at the clamping node under different short-circuit protection mechanisms.
Figure 3B:
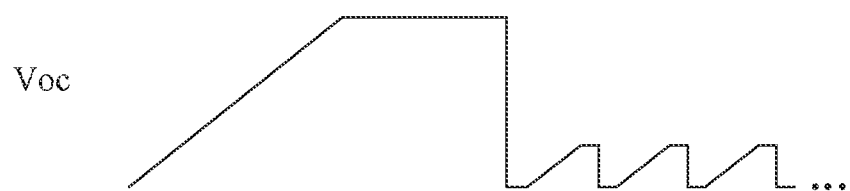

FIG. 3A and FIG. 3B are diagrams of the waveforms of the voltage Voc at the clamping node OC under different short-circuit protection mechanisms.

In FIG. 3A, the voltage Voc gradually increases until a highest voltage level is reached, in which the highest voltage level is limited by the presence of the voltage-fixing load 112 illustrated in FIG. 1 and FIG. 2. When the short-circuit condition is detected, the voltage Voc is pulled low by the clamping p-type transistor 108. Subsequently, the voltage Voc gradually increases again until a highest voltage level is reached.

In FIG. 3B, a similar procedure is performed. However, the frequency of the performance of the short-circuit detection is much higher. Therefore, if the short-circuit condition is not recovered yet, the voltage Voc keeps increasing and being pulled low for several times.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A soft-start circuit comprising:
   a first charging transistor conducted in response to a plurality of activating pulses to provide a first charging current to a first output node every predetermined time interval;
   a first capacitor electrically connected to the first output node to receive the first charging current such that a first output voltage at the first output node gradually increases;
   a second charging transistor conducted in response to the first output voltage to provide a second charging current to a second output node;
   a second capacitor electrically connected to the second output node to receive the second charging current such that a second output voltage at the second output node gradually increases; and
   a clamping p-type transistor comprising a source terminal electrically connected to a clamping node, a drain terminal connected to a ground terminal and a gate electrically connected to the second output node, wherein the clamping p-type transistor is conducted when a voltage at the clamping node exceeds a clamping threshold value to pull low the voltage at the clamping node,
   wherein the clamping node is an amplifier output node of an operational amplifier disposed in a voltage converting circuit.

2. The soft-start circuit of claim 1, further comprising a voltage-fixing load electrically connected to the first output node to prevent the first output voltage from exceeding a maximum voltage level.

3. The soft-start circuit of claim 2, wherein the voltage-fixing load comprises a plurality of diodes connected in series.

4. The soft-start circuit of claim 1, wherein the clamping threshold value is a sum of the second output voltage and a threshold voltage of the clamping p-type transistor.

5. The soft-start circuit of claim 1, wherein the voltage converting circuit comprises a low-dropout (LDO) regulator, a boost circuit, a buck circuit or a charge pump circuit.

6. The soft-start circuit of claim 1, further comprising a first discharging transistor electrically connected to the first output node, wherein the first discharging transistor is activated to discharge the first output node when a short-circuit condition of the voltage converting circuit is detected.

7. The soft-start circuit of claim 6, wherein the voltage converting circuit further comprises a short-circuit detection module to detect the short-circuit condition of the voltage converting circuit so as to activate the first discharging transistor.

8. The soft-start circuit of claim 1, further comprising a second discharging transistor electrically connected to the second output node to keep discharging the second output node, wherein a charging ability of the second charging transistor is greater than a discharging ability of the second discharging transistor.

9. The soft-start circuit of claim 1, wherein the plurality of activating pulses are provided by a one-shot circuit.

10. A power supplying circuit comprising:
    a voltage converting circuit having an operational amplifier configured in a feedback configuration that comprises an amplifier output node; and
    a soft-start circuit comprising:
       a first charging transistor conducted in response to a plurality of activating pulses to provide a first charging current to a first output node every predetermined time interval;
       a first capacitor electrically connected to the first output node to receive the first charging current such that a first output voltage at the first output node gradually increases;
       a second charging transistor conducted in response to the first output voltage to provide a second charging current to a second output node;
       a second capacitor electrically connected to the second output node to receive the second charging current such that a second output voltage at the second output node gradually increases; and
       a clamping p-type transistor comprising a source terminal electrically connected to the amplifier output node, a drain terminal connected to a ground terminal and a gate electrically connected to the second output node, wherein the clamping p-type transistor is conducted when a voltage at the amplifier output node exceeds a clamping threshold value to pull low the voltage at the amplifier output node.

11. The power supplying circuit of claim 10, wherein the soft-start circuit further comprises a voltage-fixing load electrically connected to the first output node to prevent the first output voltage from exceeding a maximum voltage level.

12. The power supplying circuit of claim 11, wherein the voltage-fixing load comprises a plurality of diodes connected in series.

13. The power supplying circuit of claim 10, wherein the clamping threshold value is a sum of the second output voltage and a threshold voltage of the clamping p-type transistor.

14. The power supplying circuit of claim 10, wherein the voltage converting circuit comprises a low-dropout (LDO) regulator, a boost circuit, a buck circuit or a charge pump circuit.

15. The power supplying circuit of claim 10, wherein the soft-start circuit further comprises a first discharging transistor electrically connected to the first output node, wherein the first discharging transistor is activated to discharge the first output node when a short-circuit condition of the voltage converting circuit is detected.

16. The power supplying circuit of claim 15, wherein the voltage converting circuit further comprises a short-circuit detection module to detect the short-circuit condition of the voltage converting circuit so as to activate the first discharging transistor.

17. The power supplying circuit of claim 10, wherein the soft-start circuit further comprises a second discharging transistor electrically connected to the second output node to keep discharging the second output node, wherein a charging ability of the second charging transistor is greater than a discharging ability of the second discharging transistor.

18. The power supplying circuit of claim 10, wherein the plurality of activating pulses are provided by a one-shot circuit.

* * * * *